United States Patent
Miyamoto

(10) Patent No.: US 7,482,817 B2
(45) Date of Patent: Jan. 27, 2009

(54) METHOD AND AN APPARATUS FOR MEASURING THE INPUT THRESHOLD LEVEL OF DEVICE UNDER TEST

(75) Inventor: Junichi Miyamoto, Tokyo (JP)

(73) Assignee: Verigy (Singapore) Pte. Ltd., Singapore (SG)

( * ) Notice: Subject to any disclaimer, the term of this patent is extended or adjusted under 35 U.S.C. 154(b) by 316 days.

(21) Appl. No.: 11/518,766

(22) Filed: Sep. 11, 2006

(65) Prior Publication Data

US 2007/0063710 A1 Mar. 22, 2007

(30) Foreign Application Priority Data

Sep. 22, 2005 (JP) ............................. 2005-276208

(51) Int. Cl.
*G01R 19/00* (2006.01)
*G01R 27/00* (2006.01)

(52) U.S. Cl. ................. 324/603; 324/76.18; 324/76.25; 324/605

(58) Field of Classification Search ............. 324/76.18, 324/603, 605, 76.25, 617, 618
See application file for complete search history.

(56) References Cited

U.S. PATENT DOCUMENTS

| 7,271,610 B2 * | 9/2007 | Walker et al. ................ 324/765 |
| 2005/0189950 A1 | 9/2005 | Lu .............................. 324/606 |
| 2006/0170445 A1 * | 8/2006 | Driscoll ...................... 324/765 |
| 2008/0030220 A1 * | 2/2008 | Agarwal et al. ............. 324/771 |

FOREIGN PATENT DOCUMENTS

| JP | 3-21565 | | 1/1991 |
| JP | 03216565 A | * | 9/1991 |

* cited by examiner

*Primary Examiner*—Vincent Q Nguyen
*Assistant Examiner*—John Zhu
(74) *Attorney, Agent, or Firm*—Holland & Hart, LLP

(57) ABSTRACT

A signal including at least one group of a group comprised of two slopes having different gradients and a known temporal position relationship is applied to a device under test, the time intervals between the specific transitions of the logic level produced in the output signal of the device under test in response to the slopes included in the applied signal are measured, and the measurements are used to obtain the input threshold level of the device under test.

26 Claims, 7 Drawing Sheets

METHOD AND AN APPARATUS FOR MEASURING THE INPUT THRESHOLD LEVEL OF DEVICE UNDER TEST

FIELD OF THE INVENTION

The present invention relates to a technique for measuring the input threshold level of a device under test.

DISCUSSION OF THE BACKGROUND ART

Conventionally, the input threshold level of a device under test is given by the input signal level when a signal having a level varying in steps is input to a device under test and the output signal of the device under test varies, or it is calculated from the delay time from the signal input, when a ramp signal is input to the device under test, to the change in the output signal of the device under test and the gradient of the slope part of the ramp signal (i.e., see JP Unexamined Patent Application No. H3-216,565 (p. 2, FIG. 2, FIG. 5)). The level denotes the magnitude in the amplitude direction.

A method for inputting a signal having a level varying in steps to a device under test is a static test and cannot measure a dynamic threshold level in the actual operating environment of the device under test. In addition, the above-mentioned method for inputting a ramp signal to a device under test requires a time measurement device synchronized to the input ramp signal in order to know the delay time. Therefore, an object of the present invention is to provide a method or an apparatus for measuring the input threshold level of a device under test without synchronizing to the signal input to the device under test.

SUMMARY OF THE INVENTION

The present invention applies a signal including at least one group comprised of two slopes that have different gradients and a known temporal position relationship to a device under test and obtains an input threshold level of the device under test from the measurements of the output signal of the device under test and the waveform parameters of the applied signal. That is, a method for measuring the input threshold level of a device under test and comprises a step for inputting a first signal that includes a first slope and a second slope having different gradients and a known relative temporal position relationship to the device under test; a step for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; and a step for calculating the above-mentioned input threshold level by using at least the gradients of the above-mentioned slopes and the above-mentioned time interval.

Additionally, the present invention includes a method for measuring the input threshold level of the device under test and comprises a step for inputting a first signal including a first slope and a second slope having different gradients and a known relative temporal position relationship to the device under test; a step for inputting a second signal including a third slope and a fourth slope having different gradients and a known relative temporal position relationship to the device under test; a step for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; a step for measuring the time interval between the time when a logic level transition occurs in the output signal of the above-mentioned device under test in response to the above-mentioned third slope and the time when a logic level transition occurs in the output signal of the above-mentioned device under test in response to the above-mentioned fourth slope; and a step for calculating the above-mentioned input threshold level by using at least the gradients of the above-mentioned slopes and the above-mentioned time intervals.

Another embodiment includes a method for measuring the input threshold level of a device under test and comprises a step for inputting a signal having a first slope and a second slope having different gradients and a known relative temporal position relationship, and a third slope and a fourth slope having different gradients and a known relative temporal position relationship to the device under test; a step for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; a step for measuring the time interval between the time when a logic level transition occurs in the output signal of the above-mentioned device under test in response to the above-mentioned third slope and the time when a logic level transition occurs in the output signal of the above-mentioned device under test in response to the above-mentioned fourth slope; and a step for calculating the above-mentioned input threshold level by using at least the gradients of the above-mentioned slopes and the above-mentioned time intervals.

Preferably, the above-mentioned first slope as a rising slope, the above-mentioned second slope as a falling slope, and the above-mentioned first slope and the above-mentioned second slope in at least one part of the same triangle wave or the same trapezoid wave.

The above-mentioned first slope and the above-mentioned third slope as rising slopes, the above-mentioned second slope and the above-mentioned fourth slope as falling slopes, the above-mentioned first slope and the above-mentioned second slope in at least a part of the same triangle wave or the same trapezoid wave, and the above-mentioned third slope and the above-mentioned fourth slope in at least one part of the same triangle wave or the same trapezoid wave.

The maximum level of the above-mentioned first slope is preferably set equal to the maximum level of the above-mentioned second slope, and the minimum level of the above-mentioned first slope equal to the minimum level of the above-mentioned second slope.

The maximum level of the above-mentioned first slope is optionally set equal to the maximum level of the above-mentioned second slope, the minimum level of the above-mentioned first slope equal to the minimum level of the above-mentioned second slope, the maximum level of the above-mentioned third slope equal to the maximum level of the above-mentioned fourth slope, and the minimum level of the above-mentioned third slope equal to the minimum level of the above-mentioned fourth slope.

Another embodiment of the present invention is an apparatus for measuring the input threshold level of a device under test and comprises signal generation means for generating a first signal that includes a first slope and a second slope having different gradients and a known relative temporal position relationship; time measurement means for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; and calculation means for calculating the above-mentioned input threshold level by using at least the gradients of the above-mentioned slopes and the above-mentioned time interval.

Still another embodiment is an apparatus for measuring the input threshold level of a device under test and comprises signal generation means for generating a first signal that includes a first slope and a second slope having different gradients and a known relative temporal position relationship; signal generation means for generating a second signal that includes a third slope and a fourth slope having different gradients and a known relative temporal position relationship; time measurement means for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; time measurement means for measuring the time interval between the time when a logic level transition occurs in the output signal of the above-mentioned device under test in response to the above-mentioned third slope and the time when a logic level transition occurs in the output signal of the above-mentioned device under test in response to the above-mentioned fourth slope; and calculation means for calculating the above-mentioned input threshold level by using at least the gradients of the above-mentioned slopes and the above-mentioned time intervals.

Another embodiment is an apparatus for measuring the input threshold level of a device under test and comprises signal generation means for generating a signal that includes a first slope and a second slope having different gradients and a known relative temporal position relationship, and a third slope and a fourth slope having different gradients and a known relative temporal position relationship; time measurement means for measuring the time interval between the time when a logic level transition occurs in the output signal of the above-mentioned device under test in response to the above-mentioned first slope and the time when a logic level transition occurs in the output signal of the above-mentioned device under test in response to the above-mentioned second slope; time measurement means for measuring the time interval between the time when a logic level transition occurs in the output signal of the above-mentioned device under test in response to the above-mentioned third slope and the time when a logic level transition occurs in the output signal of the above-mentioned device under test in response to the above-mentioned fourth slope; and calculation means for calculating the above-mentioned input threshold level by using at least the gradients of the above-mentioned slopes and the above-mentioned time intervals.

Preferably, the above-mentioned first slope as a rising slope, the above-mentioned second slope as a falling slope, and the above-mentioned first slope and the above-mentioned second slope in at least a part of the same triangle wave or the same trapezoid wave.

The above-mentioned first slope and the above-mentioned third slope as the rising slopes, the above-mentioned second slope and the above-mentioned fourth slope as the falling slopes, the above-mentioned first slope and the above-mentioned second slope in at least a part of the same triangle wave or the same trapezoid wave, and the above-mentioned third slope and the above-mentioned fourth slope in at least one part of the same triangle wave or the same trapezoid wave.

The maximum level of the above-mentioned first slope is preferably set equal to the maximum level of the above-mentioned second slope, and the minimum level of the above-mentioned first slope equal to the minimum level of the above-mentioned second slope.

The maximum level of the above-mentioned first slope is optionally set equal to the maximum level of the above-mentioned second slope, the minimum level of the above-mentioned first slope equal to the minimum level of the above-mentioned second slope, the maximum level of the above-mentioned third slope equal to the maximum level of the above-mentioned fourth slope, and the minimum level of the above-mentioned third slope equal to the minimum level of the above-mentioned fourth slope.

According to the present invention, a signal including at least a group comprised of two slopes having different gradients and a known temporal position relationship is applied to a device under test; the time interval between specific logic level transitions generated in the output signal of the device under test in response to the slopes included in the applied signal is measured; and the input threshold level of the device under test is obtained by using the above-mentioned measurements; and the apparatus for measuring the time interval does not need to be synchronized to the applied signal.

DETAILED DESCRIPTION OF THE PREFERRED EMBODIMENT

Next, the present invention is explained based on preferred embodiments shown in the attached drawings. The embodiment of the present invention is a semiconductor tester that functions as an apparatus for measuring the input threshold level of a device under test.

First Embodiment

Figure 1:
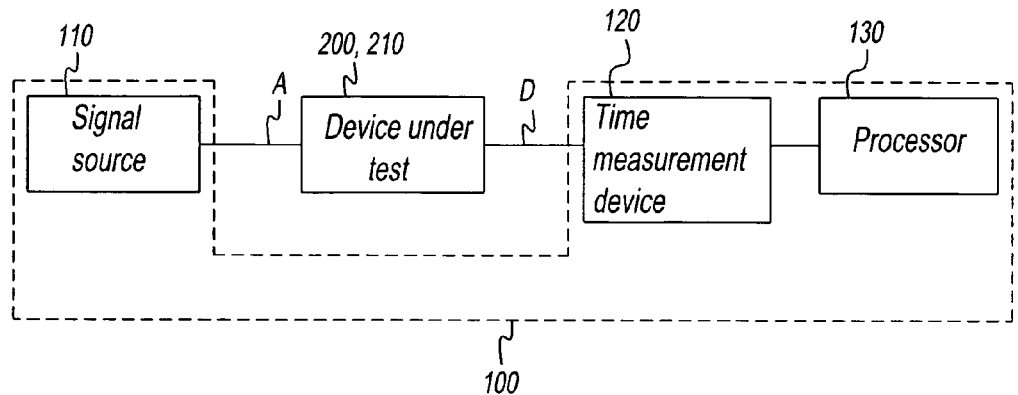
FIG. 1 is a block diagram showing the internal structure of semiconductor tester 100.

Here, FIG. 1 is referenced. FIG. 1 is a block diagram showing the structure of a semiconductor tester 100 of the present invention. Hereafter, FIG. 1 is always referenced. Semiconductor tester 100 is connected to a device under test 200. Device under test 200 is an apparatus for digitizing the input signal based on prescribed reference levels and outputting the digital signal D as the digitization result, for example, a logic circuit device or a comparator. Semiconductor tester 100 comprises a signal source 110, a time measurement device 120, and a processor 130. Signal source 110 is an apparatus for generating a signal A to be applied to device under test 200. For example, signal source 110 is an arbitrary waveform generator. Time measurement device 120 is an apparatus for measuring the times a logic level transition occurs in signal D output by device under test 200 and the time interval between specific transitions of the above-mentioned transitions generated in signal D, or the pulse width of signal D. For example, time measurement device 120 is a time interval analyzer. Processor 130 is an apparatus for executing specific processes on the measurements of time measurement device 120 and calculating the input threshold level of the device under test. For example, processor 130 is a computational apparatus such as an MPU or DSP.

Figure 2:
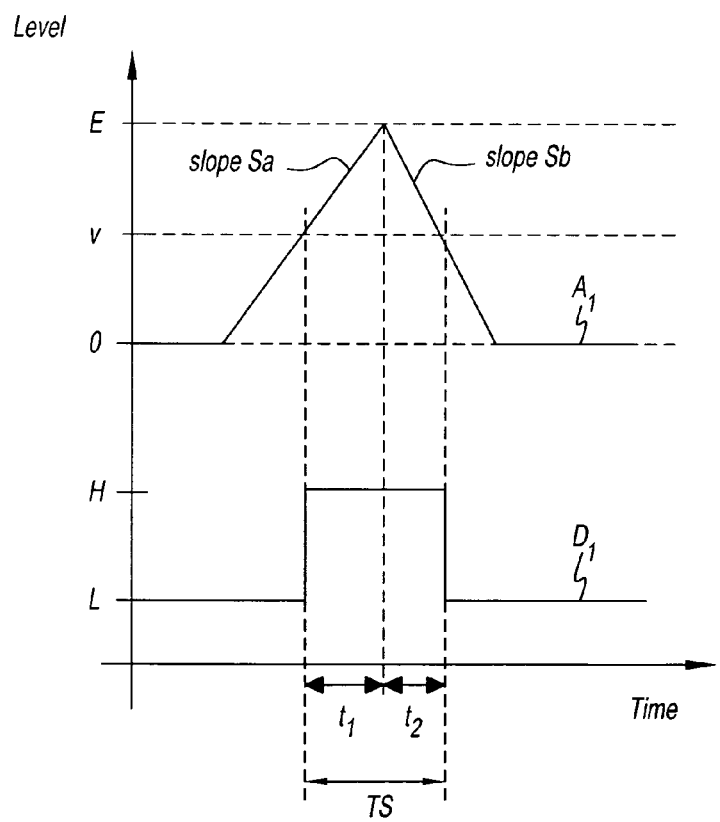
FIG. 2 is a timing chart showing the input signal and the output signal of device under test 200.

Next, the operation of semiconductor tester 100 is explained. Here, FIG. 2 is referenced. The top graph in FIG. 2 shows the signal $A_1$ generated by signal source 110 and applied to device under test 200. The v indicated in the top graph in FIG. 2 denotes the input threshold level of device under test 200. The lower graph in FIG. 2 shows signal $D_1$ that is output from device under test 200 in response to signal $A_1$. In FIG. 2, the vertical axis indicates the signal level, and the horizontal axis indicates time. Signal $A_1$ is a signal including two successive slopes. Each slope included in signal $A_1$ is the rising slope Sa having the gradient a and the falling slope Sb having the gradient b in a time sequence. Slope Sa and slope Sb have the high level of E and the low level of 0 (zero). Device under test 200 outputs the high logic level (H) when signal $A_1$ is larger than the threshold level v. On the other hand, device under test 200 outputs the low logic level (L) when signal $A_1$ is less than or equal to threshold level v.

Time measurement device 120 measures the time interval TS between the time when a logic level transition occurs in signal $D_1$ in response to a rising slope Sa and the time when a logic level transition occurs in signal $D_1$ in response to a falling slope Sb. The time interval TS is expressed by equation (1).

Equation 1
$$TS = t_1 + t_2 = \frac{E-v}{a} + \frac{v-E}{b} \quad (1)$$

Here, $t_1$ is the time indicating the high logic level of signal $D_1$ caused by slope Sa, while $t_2$ is the time indicating the high logic level of signal $D_1$ caused by slope Sb. When equation (1) is rewritten, equation (2) is derived to calculate the input threshold level v of device under test 200.

Equation 2
$$v = \frac{ab}{a-b}TS + E \quad (2)$$

As is clear from equation (2), if time measurement device 120 measures only the pulse width of signal $D_1$, then synchronization with signal $D_1$ is not required. Then processor 130 calculates the input threshold level v of device under test 200 based on equation (2) by using the time interval TS measured by time measurement device 120 and the gradients a and b of the slopes, and the maximum level E of the slopes.

In this embodiment, the case when the characteristics of device under test 200 have a single input threshold level is analyzed.

Second Embodiment

Next, the measuring of the input threshold level of the device under test having hysteresis characteristics in the input stage is explained. In contrast to the first embodiment, the object to be measured in this embodiment is a device under test 210 (FIG. 1). Device under test 210 has two threshold levels, a maximum and a minimum, for the input signal level as in a Schmitt trigger gate. Semiconductor tester 100 is connected to device under test 210.

Figure 3:
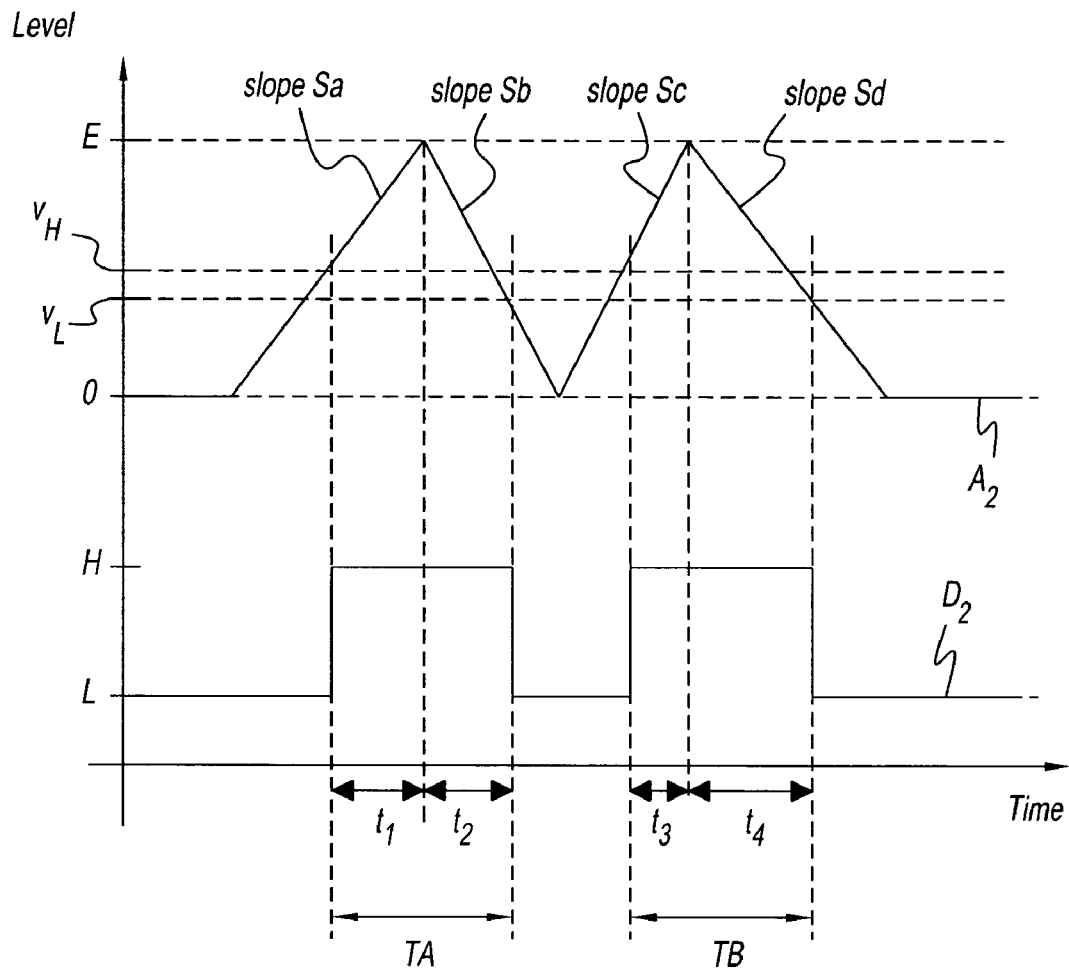
FIG. 3 is a timing chart showing the input signal and the output signal of device under test 210.

Next, the operation of semiconductor tester 100 is explained. Now, FIG. 3 is referenced. The top graph in FIG. 3 shows a signal $A_2$ that is generated by signal source 110 and applied to device under test 210. The $v_H$ indicated in the top graph of FIG. 3 denotes the maximum value of the input threshold level of device under test 210. Similarly, $v_L$ represents the minimum value of the input threshold level of device under test 210. The lower graph in FIG. 3 shows signal $D_2$ output from device under test 210 in response to signal $A_2$. In FIG. 3, the vertical axis is the signal level, and the horizontal axis is time. Signal $A_2$ is a signal including four successive slopes. Each slope included in signal $A_2$ is the rising slope Sa having gradient a, falling slope Sb having gradient b, rising slope Sc having gradient c, and falling slope Sd having gradient d. Slope Sa, slope Sb, slope Sc, and slope Sd have a maximum level of E and a minimum level of 0 (zero). Device under test 210 outputs the high logic level (H) if signal $A_2$ is greater than or equal to threshold level $v_H$. On the other hand, device under test 210 outputs the low logic level (L) if signal $A_2$ is less than the threshold level $v_L$.

Time measurement device 120 measures the time interval TA between the time when a logic level transition occurs in signal $D_2$ in response to the rising slope Sa and the time when a logic level transition occurs in signal $D_2$ in response to the falling slope Sb. Time measurement device 120 measures the time interval TB between the time when a logic level transition occurs in signal $D_2$ in response to the rising slope Sc and the time when a logic level transition occurs in signal $D_2$ in response to the falling slope Sd. The time intervals TA and TB are expressed by equations (3) and (4).

Equation 3
$$TA = t_1 + t_2 = \frac{E-v_H}{a} + \frac{v_L-E}{b} \quad (3)$$

$$TB = t_3 + t_4 = \frac{E-v_H}{c} + \frac{v_L-E}{d} \quad (4)$$

Here, $t_1$ is the time when signal $D_2$ indicates a high logic level caused by slope Sa, and $t_2$ is the time when signal $D_2$ indicates a high logic level caused by slope Sb. Also, $t_3$ is the time when signal $D_2$ indicates a high logic level caused by slope Sc, and $t_4$ is the time when signal $D_2$ indicates a high logic level caused by slope Sd. If equations (3) and (4) are rewritten, equations (5) and (6) for calculating the input threshold levels $v_H$ and $v_L$ of device under test 210 are derived.

Equation 4

$$V_H = \frac{ac}{ad-bc}(b \cdot TA - d \cdot TB) + E \quad (5)$$

$$V_L = \frac{bd}{ad-bc}(a \cdot TA - c \cdot TB) + E \quad (6)$$

As is clear from equations (5) and (6), if time measurement device 120 needs to measure only the pulse width of signal $D_2$, synchronization with signal $D_2$ is not required. Then processor 130 uses the time intervals TA and TB measured by time measurement device 120, the gradients a, b, c, and d of the slopes, and the maximum level E of the slopes to calculate the input threshold levels of $v_H$ and $v_L$ of time measurement device 120 based on equations (5) and (6). However, (ad−bc) must be non-zero to obtain the input threshold levels $v_H$ and $v_L$.

In the second embodiment, a signal applied to device under test 210 can be modified in some manner if the relative temporal position relationship between slope Sa and slope Sb, as well as the relative temporal position relationship between slope Sc and slope Sd are known.

Third Embodiment

Figure 4:
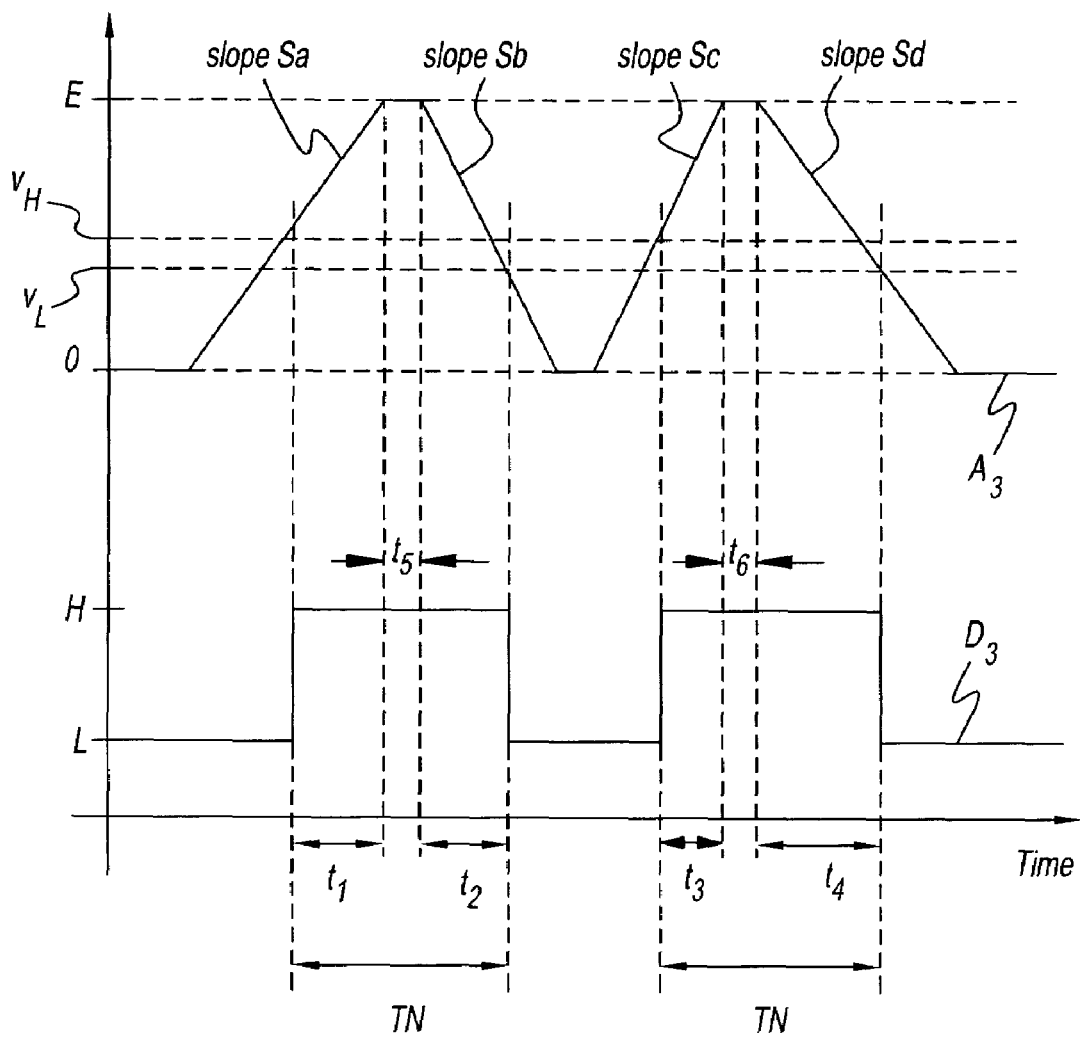
FIG. 4 is a timing chart showing the input signal and the output signal of device under test 210.

In another example, as shown in FIG. 4, a signal that does not produce transitions in the logic level in the output signal of the device under test can be provided between the slopes. In this case, the signal $A_3$ generated by signal source 110 is applied to device under test 210, and the output signal $D_3$ of device under test 210 is input to time measurement device 120. Then time measurement device 120 measures the time interval TM between the time when a logic level transition occurs in signal $D_3$ in response to the rising slope Sa and the time when a logic level transition occurs in the signal $D_3$ in response to the falling slope Sb. Time measurement device 120 measures the time interval TN between the time when a logic level transition occurs in signal $D_3$ in response to the rising slope Sc and the time when a logic level transition occurs in the signal $D_3$ in response to the falling slope Sd. The temporal distance $t_5$ between slope Sa and slope Sb and the temporal distance $t_6$ between slope Sc and slope Sd are known beforehand. In addition, TM=TA+$t_5$ and TN=TB+$t_6$. $t_1$ to $t_4$ are the same as explained in the second embodiment. Therefore, the time intervals TA and TB can be obtained in the second embodiment from the time intervals TM and TN measured by time measurement device 120. Naturally, processor 130 can calculate the input threshold levels $v_H$ and $v_L$ of device under test 210 based on equations (5) and (6) by using the time intervals TM and TN. As in the first embodiment, a signal not producing transitions in the logic level in the output signal $D_1$ of the device under test can be provided between the slopes.

Fourth Embodiment

Figure 5:
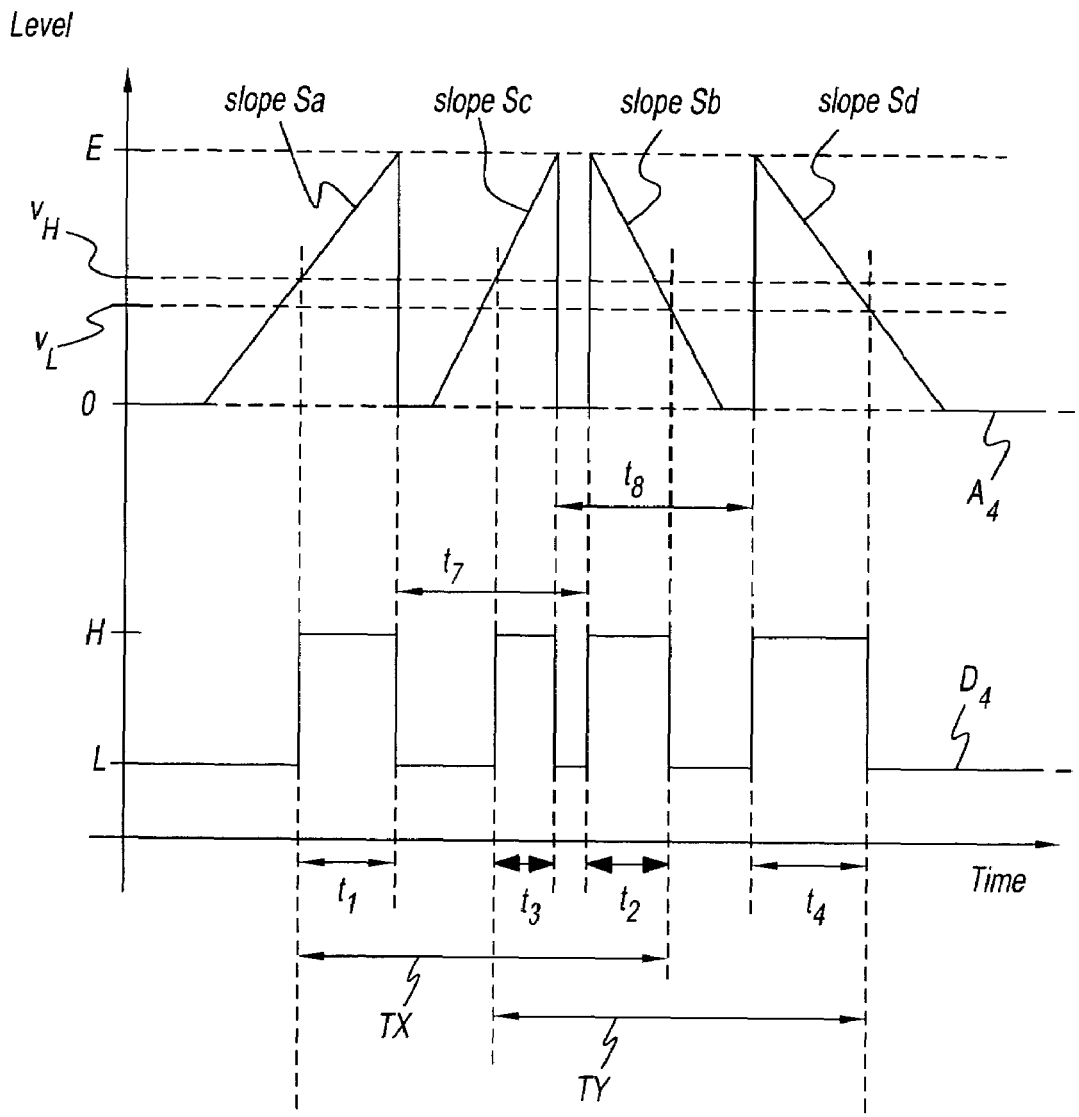
FIG. 5 is a timing chart showing the input signal and the output signal of device under test 210.

In another example, as shown in FIG. 5, the order of the slopes can be changed. In this case, a signal $A_4$ generated by signal source 110 is applied to device under test 210. The output signal $D_4$ of device under test 210 is input to time measurement device 120. Then time measurement device 120 measures the time interval TX between the time when a logic level transition occurs in signal $D_4$ in response to rising slope Sa and the time when a logic level transition occurs in signal $D_4$ in response to falling slope Sb. Time measurement device 120 measures the time interval TY between the time when a logic level transition occurs in signal $D_4$ in response to rising slope Sc and the time when a logic level transition occurs in signal $D_4$ in response to falling slope Sd. The temporal distance $t_7$ between slope Sa and slope Sb and the temporal distance $t_8$ between slope Sc and slope Sd are known beforehand. In addition, TX=TA+$t_7$ and TY=TB+$t_8$. $t_1$ to $t_4$ are the same as explained in the second embodiment. Therefore, the time intervals TA and TB in the second embodiment are obtained from the time intervals TX and TY measured by time measurement device 120. Naturally, processor 130 can calculate the input threshold levels $v_H$ and $v_L$ of device under test 210 based on equations (5) and (6) by using the time intervals TX and TY. Similarly, the signal applied to device under test 210 can be modified in some manner if the temporal position relationship between slope Sa and slope Sb is known beforehand. The alternating arrangement of the rising slope and falling slope is desired in the signal applied to device under test 210. The reason is that this contributes to less suppression of the performance demanded by signal source 110 such as the signal bandwidth. Consequently, each slope is preferably disposed to form a triangle wave and a trapezoid wave.

Fifth and Sixth Embodiments

In the above-mentioned embodiments, the high levels of slope Sa, slope Sb, slope Sc, and slope Sd can differ from each other. In this case, equation (2) is rewritten as equation (7) (fifth embodiment). Equations (5) and (6) are rewritten as equations (8) and (9) (sixth embodiment).

Equation 5 (7)

$$v = \frac{ab}{a-b}TS - \frac{aE_b bE_a}{a-b}$$

[Equation 6]

$$v_H = \frac{ac}{ad-bc}(b \cdot TA - d \cdot TB) + \frac{ac}{ad-bc}(E_b - E_d) + \quad (8)$$
$$\frac{adE_c - bcE_a}{ad-bc}$$

$$v_L = \frac{bd}{ad-bc}(a \cdot TA - c \cdot TB) + \frac{bd}{ad-bc}(E_c - E_a) + \quad (9)$$
$$\frac{adE_b - bcE_d}{ad-bc}$$

$E_a$ is the maximum level of the slope Sa. $E_b$ is the maximum level of slope Sb. $E_c$ is the maximum level of slope Sc. $E_d$ is the maximum level of slope Sd.

Further, in the above embodiments, the signal applied to the device under test can use a signal inverted in the amplitude direction.

Seventh Embodiment

Figure 6:
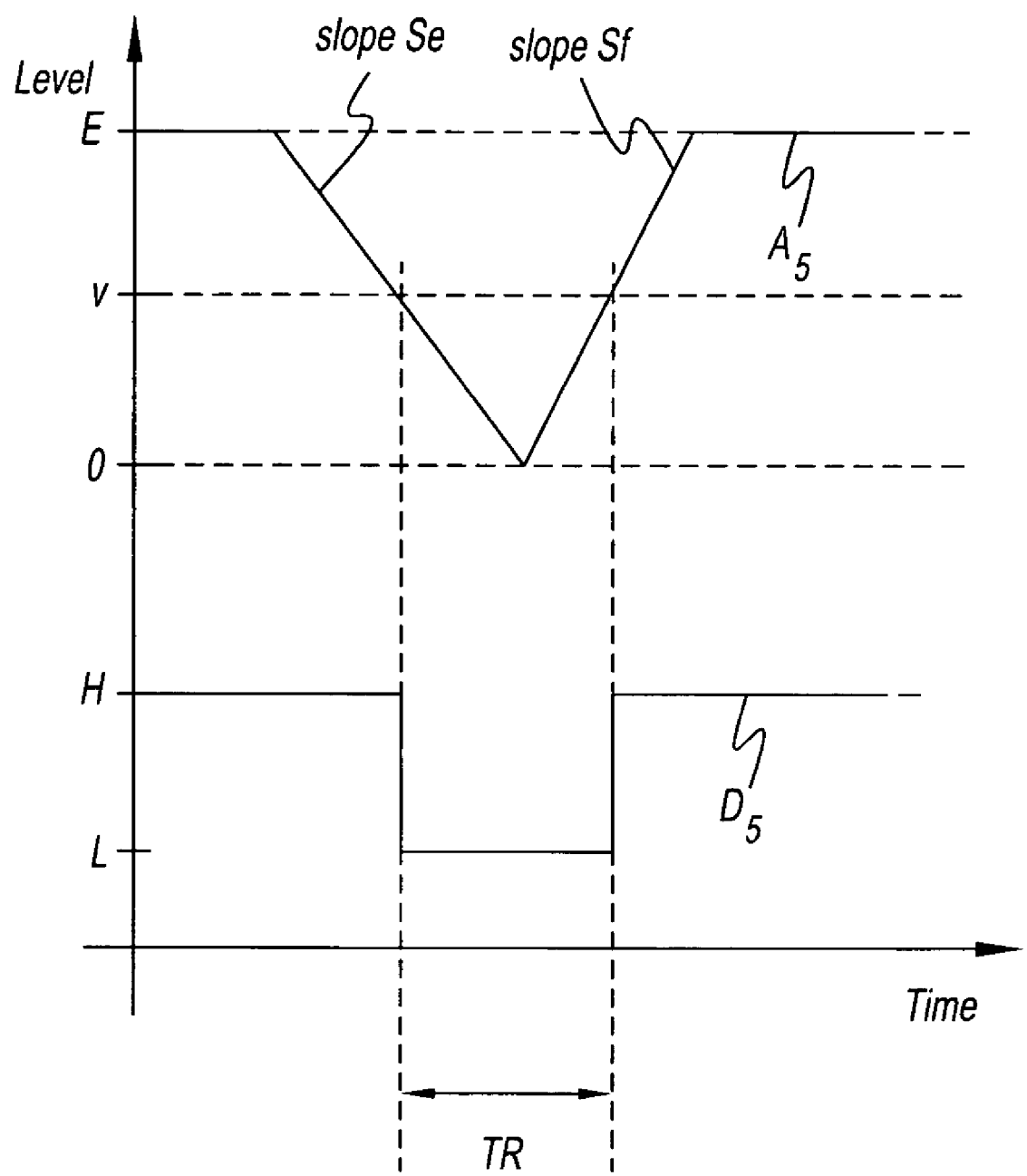
FIG. 6 is a timing chart showing the input signal and the output signal of device under test 200.

For example, signal $A_1$ shown in FIG. 2 can be varied as shown in FIG. 6. A signal $A_5$ generated by signal source 110 and applied to device under test 200 is a signal including two successive slopes. Each slope included in signal $A_5$ is a falling slope Se having gradient e and a rising slope Sf having gradient f. Slope Se and slope Sf have the maximum level of E and the minimum level of 0 (zero). Then the output signal $D_5$ of device under test 200 is applied to time measurement device 120. At this time, time measurement device 120 measures the time interval TR between the time when a logic level transition occurs in signal $D_5$ in response to falling slope Se and the time when a logic level transition occurs in signal $D_5$ in response to rising slope Sf. Then processor 130 calculates the input threshold level v of device under test 200 based on equation (10).

Equation 7

$$v = \frac{ef}{e-f} TR \qquad (10)$$

Eighth Embodiment

Figure 7:
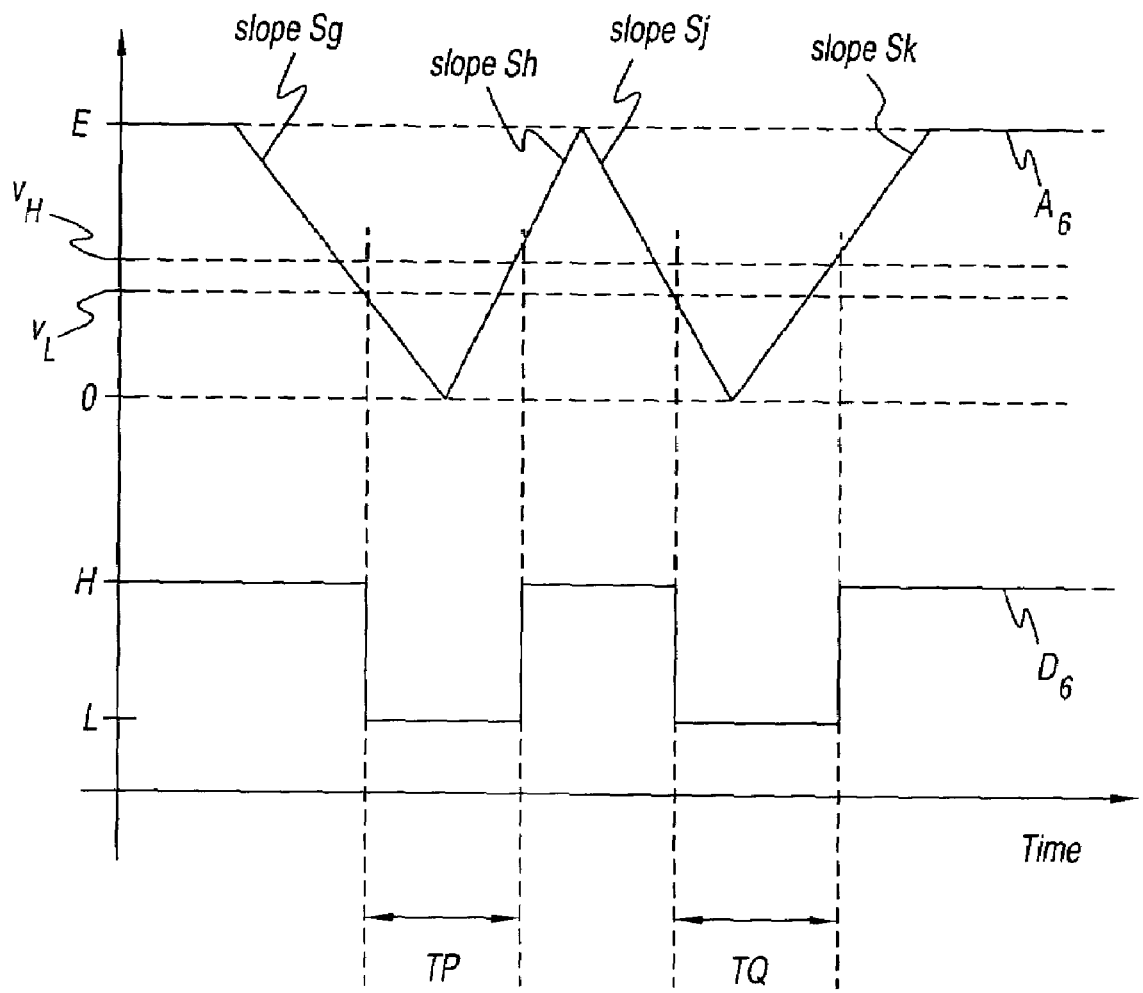
FIG. 7 is a timing chart showing the input signal and the output signal of device under test 210.

Signal $A_2$ shown in FIG. 3 can be varied as shown in FIG. 7. A signal $A_6$ generated by signal source 110 and applied to device under test 210 is a signal including four successive slopes. The slopes included in signal $A_6$ are the falling slope Sg having gradient g, rising slope Sh having gradient h, falling slope Sj having gradient j, and rising slope Sk having gradient k in a time sequence. Slope Sg, slope Sh, slope Sj, and slope Sk have the maximum level of E and the minimum level of 0 (zero). Then the output signal $D_6$ of device under test 210 is applied to time measurement device 120. At this time, time measurement device 120 measures the time interval TP between the time when a logic level transition occurs in signal $D_6$ in response to the falling slope Sg and the time when a logic level transition occurs in signal $D_6$ in response to the rising slope Sh. Time measurement device 120 measures the time interval TQ between the time when a logic level transition occurs in signal $D_6$ in response to the falling slope Sj and the time when a logic level transition occurs in signal $D_6$ in response to the rising slope Sk. Then processor 130 calculates the input threshold levels $v_H$ and $v_L$ of device under test 210 based on equation (11) and equation (12).

Equation 8

$$V_H = \frac{hk}{gk-hj}(g \cdot TP - j \cdot TQ) \qquad (11)$$

$$V_L = \frac{gj}{gk-hj}(h \cdot TP - k \cdot TQ) \qquad (12)$$

Further, in the above embodiments, a group of a rising slope and a falling slope having a known relative temporal position relationship is used, but a group comprised of two rising slopes having different gradients and a known relative temporal position relationship, or a group comprised of two falling slopes having different gradients and a known relative temporal position relationship can be used.

Ninth Embodiment

Figure 8:
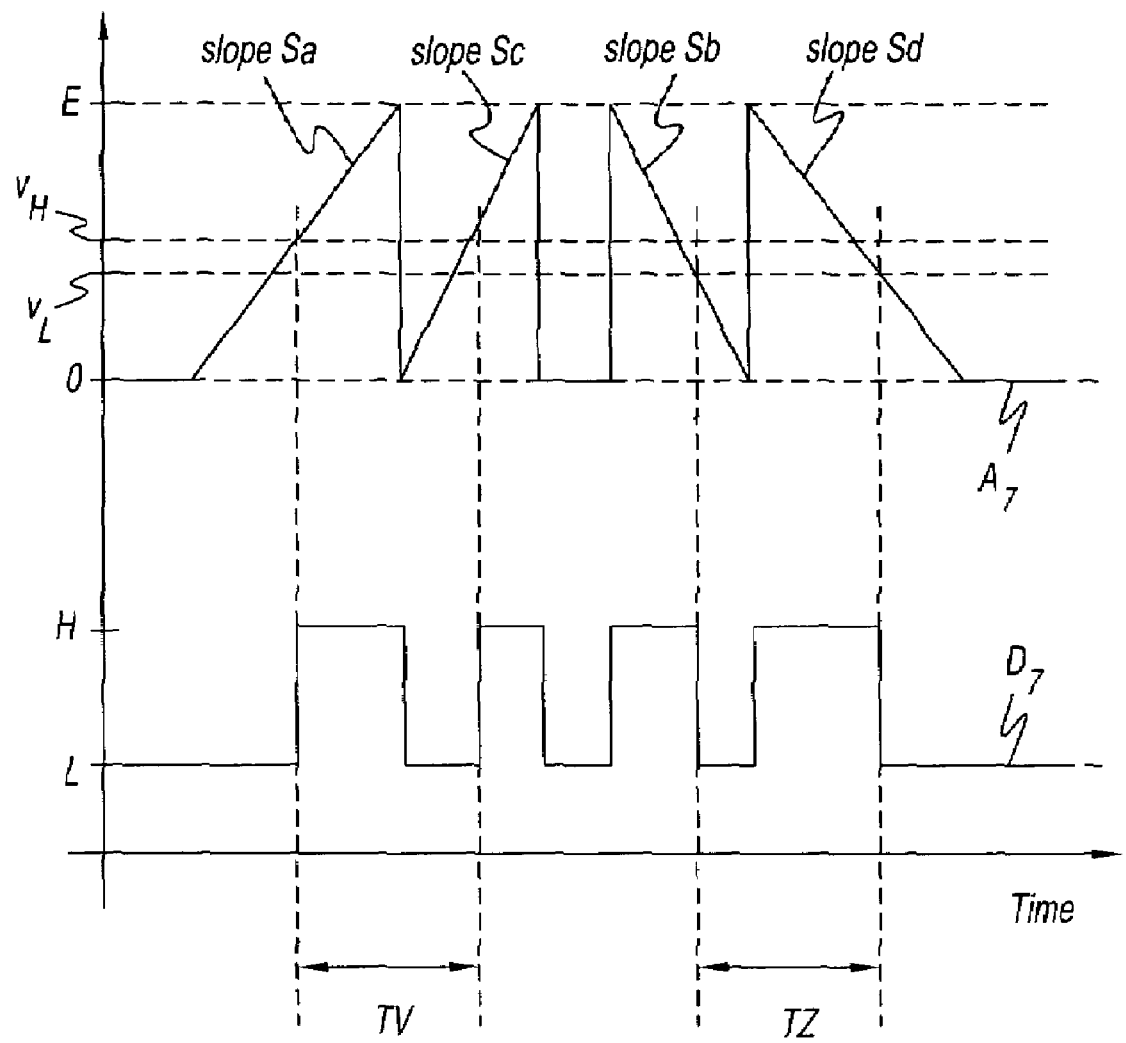
FIG. 8 is a timing chart showing the input signal and the output signal of device under test 210.

In another example, a signal $A_7$ shown in FIG. 8 can be used to measure the threshold levels $v_H$ and $v_L$ in the second embodiment. Signal $A_7$ generated by signal source 110 and applied to device under test 210 is a signal including two successive slopes. The slopes included in signal $A_7$ are rising slope Sa having gradient a, rising slope Sc having gradient c, falling slope Sb having gradient b, and falling slope Sd having gradient d in a time sequence. Slope Sa, slope Sb, slope Sc, and slope Sd have the maximum level of E and the minimum level of 0 (zero). Then the output signal $D_7$ of device under test 210 is applied to time measurement device 120. At this time, time measurement device 120 measures the time interval TV between the time when a logic level transition occurs in signal $D_7$ in response to the rising slope Sa and the time when a logic level transition occurs in signal $D_7$ in response to the rising slope Sc. Time measurement device 120 measures the time interval TZ between the time when a logic level transition occurs in signal $D_7$ in response to the falling slope Sb and the time when a logic level transition occurs in signal $D_7$ in response to the falling slope Sd. Then processor 130 calculates the input threshold levels $v_H$ and $v_L$ of device under test 210 based on equation (13) and equation (14).

Equation 9

$$V_H = \frac{ac}{a-c}TV - \frac{c}{a-c}E \qquad (13)$$

$$V_L = \frac{bd}{b-d}TZ + \frac{b}{b-d}E \qquad (14)$$

Tenth Embodiment

Equation (13) and equation (14) can be used to calculate the threshold level v in the first embodiment. When equation (13) is used, signal source 110 generates a signal including rising slope Sa and rising slope Sc and inputs this signal to device under test 200. At this time, the signal output from device under test 200 is as shown in FIG. 8. When equation (14) is used, signal source 110 generates the signal including falling slope Sb and falling slope Sd and inputs this signal to device under test 200. At this time, the signal output from device under test 200 is as shown in FIG. 8.

Further, the present invention is not limited to binary digital signal systems as described in the above embodiments and is effective for multi-valued digital signal systems. For example, a device under test does not have hysteresis in the input stage and the input threshold level of the device of a three-valued digital signal system is measured. In this case, two logic level transitions occurring at different positions in the amplitude direction are generated for one slope. When two slopes are given to the device under test, four logic level transitions are generated in the output signal of the device under test. These transitions can be grouped for every level having a transition and handled. If only the transitions belonging to a specific group are examined, these transitions can be handled in the same manner as the transitions of the binary digital signal system. The method for measuring the threshold levels described in the above embodiments can be applied.

In the above embodiments, processor 130 can be separately provided as a computer or a work station.

In the above embodiments, a plurality of slopes is generated by one signal source, but all of the slopes do not have to be generated by one signal source as one signal. For example, a combination of a signal source that generates the successive slopes Sa and Sb, a signal source that generates the successive slopes Sc and Sd, and a selector for switching the outputs of the two signal sources can be used instead of signal source 110. Further, the slopes may be generated by a combination of a plurality of signal sources that separately generate each slope and a selector for switching the outputs of the signal sources.

Further, a time interval analyzer can be a specialized apparatus or can be a system that uses an apparatus for sampling a digital signal, a memory apparatus for storing the sampled results, and a processor for analyzing the time positions of the logic path transitions based on the stored sampling results.

What is claimed is:

1. A method for measuring a input threshold level of a device under test which comprises:
   inputting a first signal that includes a first slope and a second slope having different gradients and a known relative temporal position relationship to the device under test;
   measuring a time interval between a time when a logic level transition occurs in a output signal of said device under test in response to said first slope and a time when a logic level transition occurs in a output signal of said device under test in response to said second slope; and
   calculating said input threshold level by using at least the gradients of said slopes and said time interval.

2. The method of claim 1, wherein said first slope is a rising slope; said second slope is a falling slope; and said first slope and said second slope are at least one part of the same triangle wave or the same trapezoid wave.

3. The method of claim 1, wherein the maximum level of said first slope equals the maximum level of said second slope; and the minimum level of said first slope equals the minimum level of said second slope.

4. A method for measuring a input threshold level of a device under test which comprises:
   inputting a first signal including a first slope and a second slope having different gradients and a known relative temporal position relationship to the device under test;
   inputting a second signal including a third slope and a fourth slope having different gradients and a known relative temporal position relationship to the device under test;
   measuring a time interval between a time when a logic level transition occurs in a output signal of said device under test in response to said first slope and a time when a logic level transition occurs in a output signal of said device under test in response to said second slope;
   measuring a time interval between a time when a logic level transition occurs in a output signal of said device under test in response to said third slope and a time when a logic level transition occurs in a output signal of said device under test in response to said fourth slope; and
   calculating said input threshold level by using at least the gradients of said slopes and said time intervals.

5. The method of claim 4, wherein said first slope is a rising slope; said second slope is a falling slope; and said first slope and said second slope are at least one part of the same triangle wave or the same trapezoid wave.

6. The method according to claim 4, wherein said first slope and said third slope are rising slopes; said second slope and said fourth slope are falling slopes; said first slope and said second slope are at least a part of the same triangle wave or the same trapezoid wave; and said third slope and said fourth slope are at least one part of the same triangle wave or the same trapezoid wave.

7. The method according to claim 4, wherein the maximum level of said first slope equals the maximum level of said second slope; and the minimum level of said first slope equals the minimum level of said second slope.

8. The method according to claim 4, wherein the maximum level of said first slope equals the maximum level of said second slope, the minimum level of said first slope equals the minimum level of said second slope, the maximum level of said third slope equals the maximum level of said fourth slope, and the minimum level of said third slope equals the minimum level of said fourth slope.

9. A method for measuring a input threshold level of the device under test which comprises:
   inputting a signal having a first slope and a second slope having different gradients and a known relative temporal position relationship, and a third slope and a fourth slope having different gradients and a known relative temporal position relationship to the device under test;
   measuring a time interval between a time when a logic level transition occurs in a output signal of said device under test in response to said first slope and a time when a logic level transition occurs in a output signal of said device under test in response to said second slope;
   measuring a time interval between a time when a logic level transition occurs in a output signal of said device under test in response to said third slope and a time when a logic level transition occurs in a output signal of said device under test in response to said fourth slope; and
   calculating said input threshold level by using at least the gradients of said slopes and said time intervals.

10. The method of claim 9, wherein said first slope is a rising slope;
    said second slope is a falling slope; and said first slope and said second slope are at least one part of the same triangle wave or the same trapezoid wave.

11. The method according to claim 9, wherein
    said first slope and said third slope are rising slopes;
    said second slope and said fourth slope are falling slopes;
    said first slope and said second slope are at least a part of the same triangle wave or the same trapezoid wave; and
    said third slope and said fourth slope are at least one part of the same triangle wave or the same trapezoid wave.

12. The method according to claim 9, wherein the maximum level of said first slope equals the maximum level of said second slope; and the minimum level of said first slope equals the minimum level of said second slope.

13. The method according to claim 9, wherein the maximum level of said first slope equals the maximum level of said second slope, the minimum level of said first slope equals the minimum level of said second slope, the maximum level of said third slope equals the maximum level of said fourth slope, and the minimum level of said third slope equals the minimum level of said fourth slope.

14. An apparatus for measuring a input threshold level of a device under test which comprises:
    a signal generator that generates a first signal that comprises a first slope and a second slope having different gradients and a known relative temporal position relationship;
    a time measuring device that measures a time interval between a time when a logic level transition occurs in a output signal of said device under test in response to said first slope and a time when a logic level transition occurs in a output signal of said device under test in response to said second slope; and
    a calculator that calculates said input threshold level by using at least the gradients of said slopes and said time interval.

15. The apparatus according to claim 14, wherein said first slope is a rising slope; said second slope is a falling slope; and said first slope and said second slope are at least a part of the same triangle wave or the same trapezoid wave.

16. The apparatus of claim 14, wherein the maximum level of said first slope equals the maximum level of said second slope, and the minimum level of said first slope equals the minimum level of said second slope.

17. An apparatus for measuring a input threshold level of a device under test which comprises:
- a first signal generator that generates a first signal that includes a first slope and a second slope having different gradients and a known relative temporal position relationship;
- a second signal generator that generates a second signal that includes a third slope and a fourth slope having different gradients and a known relative temporal position relationship;
- a first time measuring device that measures a time interval between a time when a logic level transition occurs in a output signal of said device under test in response to said first slope and a time when a logic level transition occurs in a output signal of said device under test in response to said second slope;
- a second time measuring device that measures a time interval between a time when a logic level transition occurs in a output signal of said device under test in response to said third slope and a time when a logic level transition occurs in a output signal of said device under test in response to said fourth slope; and
- a calculator that calculates said input threshold level by using at least the gradients of said slopes and said time intervals.

18. The apparatus according to claim 17, wherein said first slope is a rising slope; said second slope is a falling slope; and said first slope and said second slope are at least a part of the same triangle wave or the same trapezoid wave.

19. The apparatus of claim 17, wherein said first slope and said third slope are rising slopes; said second slope and said fourth slope are falling slopes; said first slope and said second slope are at least one part of the same triangle wave or the same trapezoid wave; and said third slope and said fourth slope are at least one part of the same triangle wave or the same trapezoid wave.

20. The apparatus of claim 17, wherein the maximum level of said first slope equals the maximum level of said second slope, and the minimum level of said first slope equals the minimum level of said second slope.

21. The apparatus of claim 17, wherein the maximum level of said first slope equals the maximum level of said second slope, the minimum level of said first slope equals the minimum level of said second slope, the maximum level of said third slope equals the maximum level of said fourth slope, and the minimum level of said third slope equals the minimum level of said fourth slope.

22. An apparatus for measuring a input threshold level of a device under test which comprises:
- a signal generator that generates a signal that includes a first slope and a second slope having different gradients and a known relative temporal position relationship, and a third slope and a fourth slope having different gradients and a known relative temporal position relationship;
- a first time measuring device that measures a time interval between a time when a logic level transition occurs in a output signal of said device under test in response to said first slope and a time when a logic level transition occurs in a output signal of said device under test in response to said second slope;
- a second time measuring device that measures a time interval between a time when a logic level transition occurs in a output signal of said device under test in response to said third slope and a time when a logic level transition occurs in a output signal of said device under test in response to said fourth slope; and
- a calculator that calculates said input threshold level by using at least the gradients of said slopes and said time intervals.

23. The apparatus according to claim 22, wherein said first slope is a rising slope; said second slope is a falling slope; and said first slope and said second slope are at least a part of the same triangle wave or the same trapezoid wave.

24. The apparatus of claim 22, wherein said first slope and said third slope are rising slopes; said second slope and said fourth slope are falling slopes; said first slope and said second slope are at least one part of the same triangle wave or the same trapezoid wave; and said third slope and said fourth slope are at least one part of the same triangle wave or the same trapezoid wave.

25. The apparatus of claim 22, wherein the maximum level of said first slope equals the maximum level of said second slope, and the minimum level of said first slope equals the minimum level of said second slope.

26. The apparatus of claim 22, wherein the maximum level of said first slope equals the maximum level of said second slope, the minimum level of said first slope equals the minimum level of said second slope, the maximum level of said third slope equals the maximum level of said fourth slope, and the minimum level of said third slope equals the minimum level of said fourth slope.

* * * * *